US009577507B2

(12) United States Patent
Lim et al.

(10) Patent No.: US 9,577,507 B2
(45) Date of Patent: Feb. 21, 2017

(54) INVERTER ASSEMBLY WITHOUT GALVANIC ISOLATION

(71) Applicant: LSIS CO., LTD., Anyang-si, Gyeonggi-do (KR)

(72) Inventors: Deokyoung Lim, Cheonan-si (KR); Chun Suk Yang, Seongnam-si (KR)

(73) Assignee: LSIS CO., LTD., Anyang-si (KR)

( * ) Notice: Subject to any disclaimer, the term of this patent is extended or adjusted under 35 U.S.C. 154(b) by 54 days.

(21) Appl. No.: 14/745,218

(22) Filed: Jun. 19, 2015

(65) Prior Publication Data
US 2016/0028300 A1   Jan. 28, 2016

(30) Foreign Application Priority Data
Jul. 23, 2014   (KR) .................. 10-2014-0093070

(51) Int. Cl.
H05K 7/00   (2006.01)
H02M 1/12   (2006.01)
(Continued)

(52) U.S. Cl.
CPC ............. *H02M 1/12* (2013.01); *H02M 1/126* (2013.01); *H02M 7/003* (2013.01); *H05K 1/0215* (2013.01);
(Continued)

(58) Field of Classification Search
CPC ...... H01L 2924/01079; H05K 1/0231–1/0233; H05K 1/0263; H05K 2201/10689; H05K 1/111
(Continued)

(56) References Cited

U.S. PATENT DOCUMENTS

| 5,841,202 | A  | * | 11/1998 | Noguchi  | H04B 15/04   |
|           |    |   |         |          | 174/363      |
| 6,084,779 | A  | * | 7/2000  | Fang     | H05K 1/0216  |
|           |    |   |         |          | 174/255      |
| 6,714,092 | B1 | * | 3/2004  | Ramesh   | H05K 1/0233  |
|           |    |   |         |          | 333/12       |
| 2005/0253830 | A1 |   | 11/2005 | Jeon     |              |
| 2011/0140512 | A1 | * | 6/2011  | Pino     | B60L 3/12    |
|           |    |   |         |          | 307/9.1      |
| 2012/0119688 | A1 | * | 5/2012  | Hattori  | H02M 7/003   |
|           |    |   |         |          | 318/400.25   |
| 2014/0035497 | A1 | * | 2/2014  | Vrankovic | H02P 27/06  |
|           |    |   |         |          | 318/400.25   |

FOREIGN PATENT DOCUMENTS

EP   1912488   4/2008
JP   2000-269613   9/2000
(Continued)

OTHER PUBLICATIONS

Japan Patent Office Application Serial No. 2015-138491, Office Action dated May 17, 2016, 2 pages.
(Continued)

*Primary Examiner* — Tuan T Dinh
(74) *Attorney, Agent, or Firm* — Lee, Hong, Degerman, Kang & Waimey

(57) ABSTRACT

Disclosed is an inverter assembly without galvanic isolation, the inverter assembly including a PCB mounted with a power supply circuit unit, an inverter unit, an analogue circuit unit and a controller, a first ground circuit pattern to supply a ground power to the power supply circuit unit and the inverter unit, a second ground circuit pattern to supply the ground power to the analogue circuit unit, a third ground circuit pattern to supply the ground power to the controller, a first bead between the first ground circuit pattern and the second ground circuit pattern to isolate an impedance between the first ground circuit pattern and the second ground circuit pattern, and a second bead between the second ground circuit pattern and the third ground circuit pattern to isolate an impedance between the second ground circuit pattern and the third ground circuit pattern.

4 Claims, 3 Drawing Sheets

(51) Int. Cl.
*H02M 7/00* (2006.01)
*H05K 1/02* (2006.01)
*H05K 1/11* (2006.01)
*H05K 1/18* (2006.01)

(52) U.S. Cl.
CPC .......... *H05K 1/0227* (2013.01); *H05K 1/0233* (2013.01); *H05K 1/11* (2013.01); *H05K 1/181* (2013.01); *H05K 2201/093* (2013.01)

(58) Field of Classification Search
USPC ......... 361/760–764, 782–784, 775–777, 803
See application file for complete search history.

(56) References Cited

FOREIGN PATENT DOCUMENTS

| | | |
|---|---|---|
| JP | 2005-316373 | 11/2005 |
| JP | 2006-261479 | 9/2006 |
| JP | 2008-99480 | 4/2008 |
| JP | 2008-130584 | 6/2008 |
| KR | 10-2003-0085812 | 11/2003 |
| KR | 10-2004-0043060 | 5/2004 |

OTHER PUBLICATIONS

Armstrong, "PCB design techniques for lowest-cost EMC compliance: Part 1," Electronics and Communication Engineering Journal, XP-000930518, Aug. 1999, pp. 185-194.
European Patent Office Application Serial No. 15176483.4, Search Report dated Jan. 4, 2016, 10 pages.
Korean Intellectual Property Office Application Serial No. 10-2014-0093070, Office Action dated Dec. 23, 2015, 4 pages.

\* cited by examiner

FIG. 3
(a)
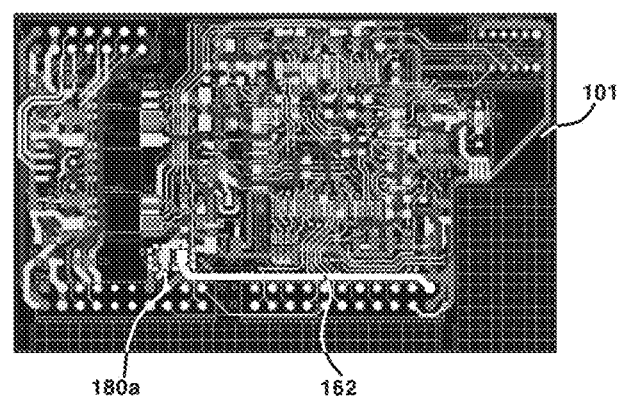
(b)
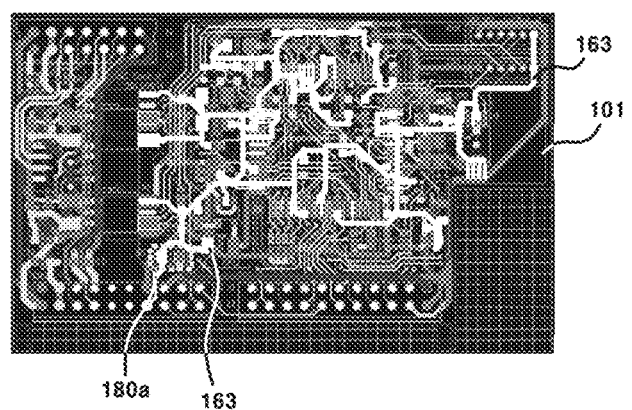

INVERTER ASSEMBLY WITHOUT GALVANIC ISOLATION

CROSS-REFERENCE TO RELATED APPLICATIONS

Pursuant to 35 U.S.C. §119(a), this application claims the benefit of earlier filing date and right of priority to Korean Patent Application No. 10-2014-0093070, filed on Jul. 23, 2014, the contents of which are all hereby incorporated by reference herein in its entirety.

TECHNICAL FIELD

The teachings in accordance with exemplary and non-limiting embodiments of the present disclosure relate generally to an inverter assembly without galvanic isolation, and particularly, to an inverter assembly without galvanic isolation configured to have a ground structure for noise-resistant reinforced characteristic in a small inverter where ground between an analog circuit and a power supply circuit is not electrically isolated.

BACKGROUND ART

An inverter is a device configured to control a motor speed and a motor torque. Although there are several methods for motor speed control, representative methods include a primary voltage control method and a frequency modulation method. An inverter may be used for efficiency control and power factor control, and may be applied to and used for spare power source, non-interrupting electric source and linear transmission.

The purpose of inverter is to perform a process control, factory automation and energy saving. For example, an inverter in a blower may adjust speed of the blower in response to types of product and output of the product. The adjustment of wind amount by a blower can adjust a temperature inside the blower to an optimum temperature, and promote improvement of product quality as well, whereby a great energy saving effect can be brought. Currently, researches on technologies for efficiently controlling an inverter are being briskly waged, in case an instantaneous interruption occurs.

Conventionally, a design must be made in a manner such that an inverter is mounted with a noise prevention part on a power input unit in order to operate without erroneous operation caused by harmonic noise introduced from the power input unit or internal switching noise, or the ground of a control circuit, an analogue circuit and power supply circuit is electrically isolated to interrupt noise introduced from the power supply circuit to the control circuit or the analogue circuit.

However, it is difficult to mount a noise prevention part to a power input unit, or to electrically isolate the ground of a control circuit, an analogue circuit and power supply circuit due to limit in product size, in case of a small-sized inverter product. An inverter that is not electrically isolated in the ground of power supply circuit has a structure susceptive to harmonic noise. A small-sized inverter cannot alleviate the harmonic noise introduced into an input unit due to difficulty in mounting a varistor on a 3-phase power input unit due to problem of product size.

Although resistance to harmonic noise may be increased by designing a noise reduction filter on an inverter protection circuit, a sensing circuit and a connection unit of a control circuit, there is a limit due to generation of loss or delay of control information.

DISCLOSURE

Technical Problem

Accordingly, the present disclosure is provided to solve the aforementioned problems/disadvantages, and therefore, it is an object of the present disclosure to provide an inverter assembly without galvanic isolation, and particularly, to an inverter assembly without galvanic isolation configured to have a ground structure for noise-resistant reinforced characteristic in a small inverter where ground between an analog circuit and a power supply circuit is not electrically isolated.

It should be emphasized, however, that the present disclosure is not limited to a particular disclosure, as explained above. It should be understood that other technical subjects not mentioned herein may be appreciated by those skilled in the art.

Technical Solution

In order to accomplish the above object, in one general aspect of the present disclosure, there is provided an inverter assembly without galvanic isolation, the inverter comprising:

a PCB (Printed Circuit Board) mounted with a power supply circuit unit, an inverter unit, an analogue circuit unit and a controller;

a first ground circuit pattern mounted on the PCB and configured to supply a ground power to the power supply circuit unit and the inverter unit;

a second ground circuit pattern mounted on the PCB and configured to supply the ground power to the analogue circuit unit;

a third ground circuit pattern mounted on the PCB and configured to supply the ground power to the controller;

a first bead mounted on the PCB between the first ground circuit pattern and the second ground circuit pattern to isolate an impedance between the first ground circuit pattern and the second ground circuit pattern;

a second bead mounted on the PCB between the second ground circuit pattern and the third ground circuit pattern to isolate an impedance between the second ground circuit pattern and the third ground circuit pattern; and an auxiliary power supply unit mounted between the first ground circuit pattern and the second ground circuit pattern to supply an auxiliary power to the inverter unit.

Preferably, but not necessarily, the first and second beads may be configured to reduce or interrupt a switching noise generated from the auxiliary power supply unit.

Preferably, but not necessarily, the first and second beads may be configured to reduce or interrupt harmonic noise.

Preferably, but not necessarily, an inverter assembly without galvanic isolation may further include an auxiliary power supply unit mounted between the first ground circuit pattern and the second ground circuit unit to supply an auxiliary power to the inverter unit, and the first and second beads may be configured to reduce or interrupt a switching noise generated from the auxiliary power supply unit.

Preferably, but not necessarily, the first and second beads may include an element configured to increase impedance at a particular harmonic area.

Preferably, but not necessarily, the first and second beads may include ferrite beads.

Advantageous Effects

Exemplary embodiments of inverter assembly without galvanic isolation have an advantageous effect in that, although ground of a control circuit and a power supply circuit is not electrically isolated, an element configured to increase impedance in a particular harmonic area is inserted to impedance-isolate a control circuit ground circuit pattern from a ground circuit pattern of a power supply circuit on a harmonic area, whereby an effect of reinforcing harmonic noise resistance (immunity) in a harmonic area can be accomplished.

DESCRIPTION OF DRAWINGS

FIG. 3 is a schematic view illustrating a circuit pattern for impedance isolation between an analogue circuit unit and a controller in an inverter assembly without galvanic isolation according to an exemplary embodiment of the present disclosure.

BEST MODE

Various exemplary embodiments will be described more fully hereinafter with reference to the accompanying drawings, in which some exemplary embodiments are shown. The present inventive concept may, however, be embodied in many different forms and should not be construed as limited to the example embodiments set forth herein. Rather, the described aspect is intended to embrace all such alterations, modifications, and variations that fall within the scope and novel idea of the present disclosure.

Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

That is, definitions of the terms "include" and "comprise," as well as derivatives thereof, may mean inclusion without limitation.

Figure 1:
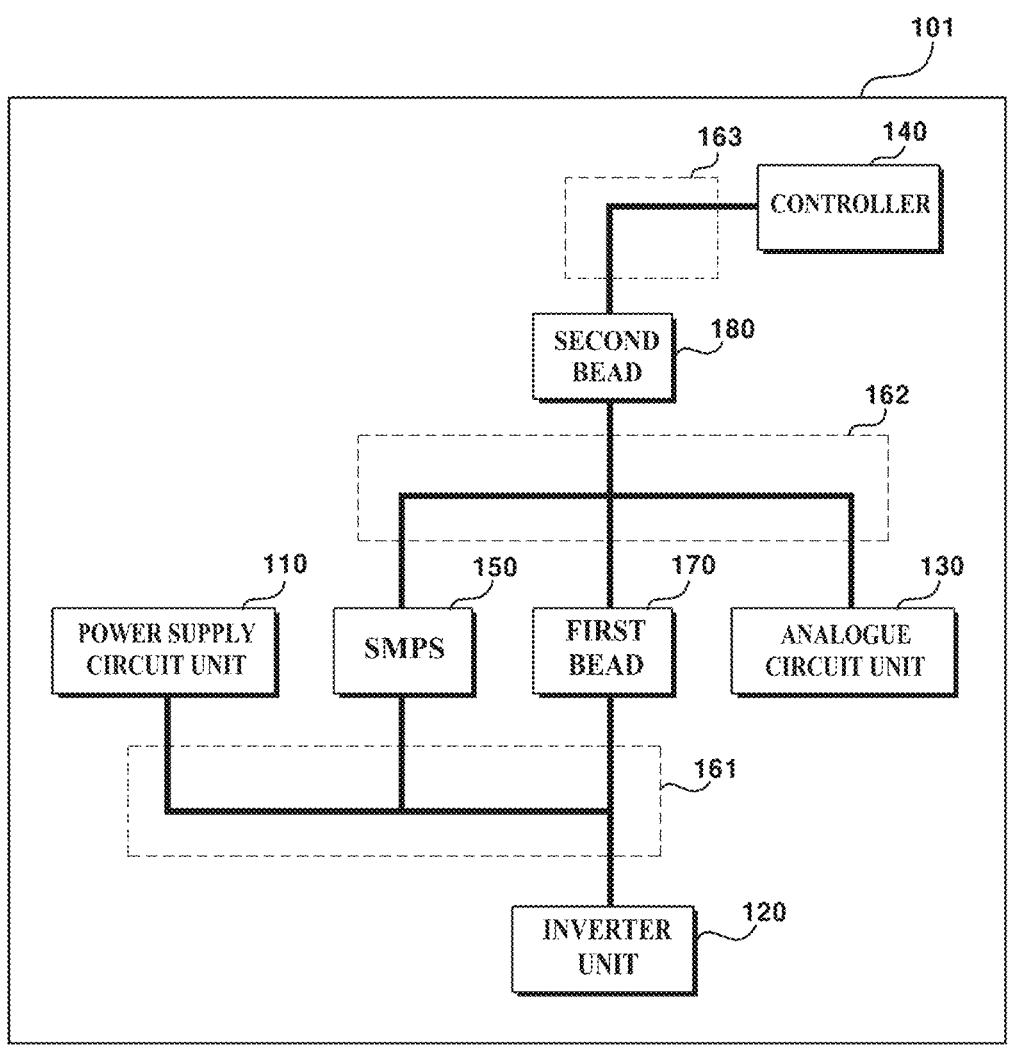
FIG. 1 is a schematic block diagram illustrating an inverter assembly without galvanic isolation according to an exemplary embodiment of the present disclosure.

FIG. 1 is a schematic block diagram illustrating an inverter assembly without galvanic isolation according to an exemplary embodiment of the present disclosure.

Referring to FIG. 1, an inverter assembly (100) without galvanic isolation according to an exemplary embodiment of the present disclosure may include a power supply circuit unit (110), an inverter unit (120), an analogue circuit unit (130), a controller (140), an SMPS (Switched-Mode Power Supply)(150), a first bead (170) and a second bead (180), where the power supply circuit unit (110), the n inverter unit (120), the analogue circuit unit (130), the controller (140), the SMPS (150), the first bead (170) and the second bead (180) may be mounted on a PCB (Printed Circuit Board, 101).

The power supply circuit unit (110) may include a rectifying circuit and a smoothing circuit, where the rectifying circuit may output an inputted AC (Alternating Current) power by rectifying the inputted AC power, and the smoothing circuit may output a DC (Direct Current) link voltage by smoothing an output voltage inputted from the rectifying circuit. The smoothing circuit may include a capacitor.

The inverter unit (120) output a DC link voltage inputted from the power supply circuit unit (110) by converting the inputted DC link voltage to an AC voltage. The analogue circuit unit (130) may include a detection circuit configured to measure an output current of the inverter unit (120) or a DC link voltage and a protection circuit. The controller (140) may control the output of the inverter unit (120) in response to the output current measured by the analogue circuit unit (130) or the DC link voltage. The SMPS (150), an auxiliary power supply unit configured to supply an auxiliary power to the inverter unit (120), the analogue circuit unit (130) and the controller (140), is mounted to supply a stable power to the inverter unit (120), the analogue circuit unit (130) and the controller (140).

When R, S, T 3-phase AC power or a single-phase AC power is supplied to the power supply circuit unit (110), the inputted AC power is charged in a DC link capacitor which is a smoothing circuit through a diode bridge which is a rectifying circuit. When the DC link voltage increases, the SMPS (150) is activated whereby an operation power is supplied to the controller (140) and the analogue circuit unit (130). The DC supplied to the power supply circuit unit (110) is switched by the inverter unit (120) to be outputted to a 3-phase AC power (U, V, W).

Meantime, the PCB (101) may be formed with the power supply circuit unit (110), the inverter unit (120) and a first ground circuit pattern (161) configured to supply a ground power to the SMPS (150). The PCB (101) may be formed with the analogue circuit unit (130) and a second ground circuit pattern (162) configured to supply a ground power to the SMPS (150). The PCB (101) may be formed with a third ground circuit pattern (163) configured to supply a ground power to the controller (140).

The PCB (101) may be formed with a first bead (170) between the first ground circuit pattern (161) and the second ground circuit pattern (162). The first bead (170) may be formed for impedance isolation between the first ground circuit pattern (161) and the second ground circuit pattern (162). The first bead (170) may reduce or interrupt noise inflow through the impedance isolation between the first ground circuit pattern (161) and the second ground circuit pattern (162).

The PCB (101) may be formed with a second bead (180) between the second ground circuit pattern (162) and the third ground circuit pattern (163). The second bead (180) may be formed for impedance isolation between the second ground circuit pattern (162) and the third ground circuit pattern (163). The second bead (180) may reduce or interrupt noise inflow through the impedance isolation between the second ground circuit pattern (162) and the third ground circuit pattern (163).

As noted from the foregoing, the ground impedance of the controller (140), the analogue circuit unit (130) and the power supply circuit unit (110) can be isolated through the first and second beads (170, 180). The first and second beads (170, 180) may be configured to reduce or interrupt the harmonic noise. The first and second beads (170, 180) may be configured to reduce or interrupt the switching noise generated from the SMPS (150).

The first and second beads (170, 180) may include an element configured to increase impedance at a particular harmonic area. For example, the first and second beads (170, 180) may include a ferrite bead. The first and second beads (170, 180) may bring forth an effect of reducing a neighboring PK type noise in a CE measurement waveform between 150 kHz and 200 kHz, for example.

When an SMPS (150) whose switching frequency is 170 kHz is used, the switching noise of the SMPS (150) may be effectively reduced or interrupted.

Figure 2:
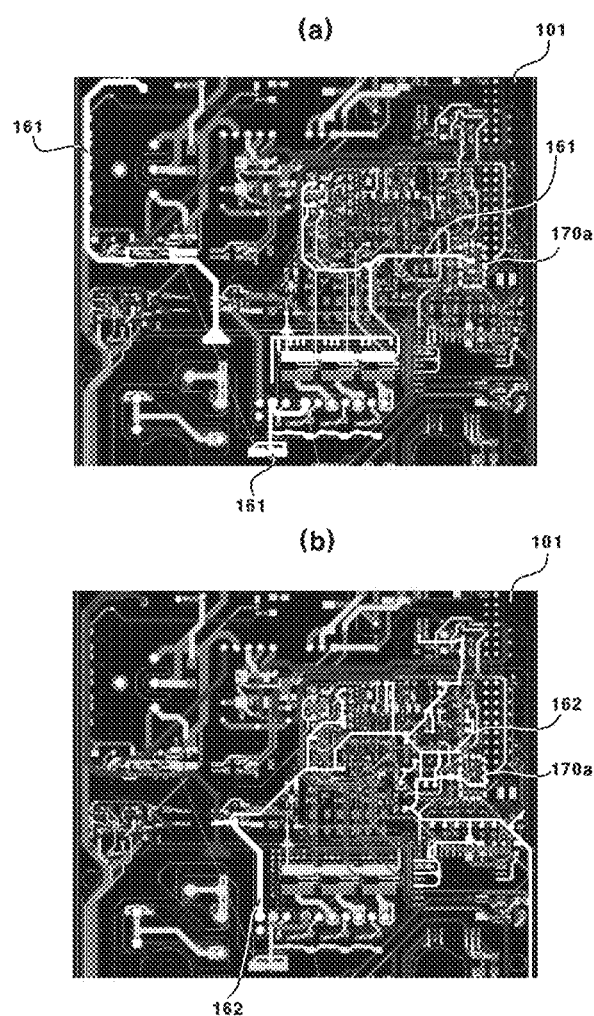
FIG. 2 is a schematic view illustrating a circuit pattern for impedance isolation between a power supply circuit unit and an analogue circuit unit in an inverter assembly without galvanic isolation according to an exemplary embodiment of the present disclosure.

FIG. 2 is a schematic view illustrating a circuit pattern for impedance isolation between a power supply circuit unit and an analogue circuit unit in an inverter assembly without galvanic isolation according to an exemplary embodiment of the present disclosure.

Referring to FIG. 2, a first ground circuit pattern (161) of the power supply circuit unit (110) is illustrated in (a) and a second ground circuit pattern (162) of the analogue circuit unit (130) is illustrated in (b). The first and second ground circuit pattern (161, 162) may realize the impedance isolation through the first bead (170) mounted at a first bead pattern installation area (170a). The first bead (170) includes an element to increase impedance at a harmonic area, whereby the impedance isolation between the first and second ground circuit pattern (161, 162) can be effectively realized. As a result, the harmonic noise introduced to the second ground circuit pattern (162) from the first ground circuit pattern (161) can be effectively reduced or interrupted.

FIG. 3 is a schematic view illustrating a circuit pattern for impedance isolation between an analogue circuit unit and a controller in an inverter assembly without galvanic isolation according to an exemplary embodiment of the present disclosure, where (a) is illustrated with the second ground circuit pattern (162) of the analogue circuit unit (130), and (b) is illustrated with the third ground circuit pattern (163) of the controller (140).

The second ground circuit pattern (162) and the third ground circuit pattern (163) may realize the impedance isolation through the second bead (180) mounted at a second bead pattern installation area (180a). The second bead (180) includes an element to increase an impedance at a harmonic area, whereby the impedance isolation between the second and third ground circuit pattern (162, 163) can be effectively realized. As a result, the harmonic noise introduced to the third ground circuit pattern (163) from the second ground circuit pattern (162) can be effectively reduced or interrupted.

The previous illustrative description of the present disclosure is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The exemplary embodiments of the present disclosure have an industrial applicability in that, although ground of a control circuit and a power supply circuit is not electrically isolated, an element configured to increase impedance in a particular harmonic area is inserted to impedance-isolate a control circuit ground circuit pattern from a ground circuit pattern of a power supply circuit on a harmonic area, whereby an effect of reinforcing harmonic noise resistance (immunity) in a harmonic area can be accomplished.

The invention claimed is:

1. An inverter assembly without galvanic isolation, the inverter comprising:
   a PCB (Printed Circuit Board) mounted with a power supply circuit unit, an inverter unit, an analogue circuit unit and a controller;
   a first ground circuit pattern mounted on the PCB and configured to supply a ground power to the power supply circuit unit and the inverter unit;
   a second ground circuit pattern mounted on the PCB and configured to supply the ground power to the analogue circuit unit;
   a third ground circuit pattern mounted on the PCB and configured to supply the ground power to the controller;
   a first bead mounted on the PCB between the first ground circuit pattern and the second ground circuit pattern to isolate an impedance between the first ground circuit pattern and the second ground circuit pattern;
   a second bead mounted on the PCB between the second ground circuit pattern and the third ground circuit pattern to isolate an impedance between the second ground circuit pattern and the third ground circuit pattern; and
   an auxiliary power supply unit mounted between the first ground circuit pattern and the second ground circuit pattern to supply an auxiliary power to the inverter unit, wherein
   the first and second beads are configured to reduce or interrupt a switching noise generated from the auxiliary power supply unit.

2. The inverter assembly of claim 1, wherein the first and second beads are configured to reduce or interrupt harmonic noise.

3. The inverter assembly of claim 1, wherein the first and second beads include an element configured to increase impedance at a particular harmonic area.

4. The inverter assembly of claim 3, wherein the first and second beads include ferrite beads.

* * * * *